United States Patent
Lof

(10) Patent No.: US 7,931,844 B2
(45) Date of Patent: *Apr. 26, 2011

(54) IMPRINT LITHOGRAPHY

(75) Inventor: Joeri Lof, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/232,710

(22) Filed: Sep. 23, 2008

(65) Prior Publication Data

US 2009/0039554 A1 Feb. 12, 2009

Related U.S. Application Data

(63) Continuation of application No. 11/129,577, filed on May 16, 2005, now Pat. No. 7,442,029.

(51) Int. Cl.
*B29C 59/00* (2006.01)
*B28B 11/00* (2006.01)

(52) U.S. Cl. ........ 264/293; 264/319; 264/485; 430/311; 216/2; 425/385; 250/492.1; 438/496

(58) Field of Classification Search .......... 264/293, 264/319, 485; 430/311, 330; 216/2; 425/385
See application file for complete search history.

(56) References Cited

U.S. PATENT DOCUMENTS

| | | |
|---|---|---|
| 674,253 A | 5/1901 | Arnold |
| 3,703,752 A | 11/1972 | Schulte |
| 5,094,536 A | 3/1992 | MacDonald et al. |
| 5,126,574 A | 6/1992 | Gallagher |
| 5,512,131 A | 4/1996 | Kumar et al. |
| 5,772,905 A | 6/1998 | Chou |
| 5,856,672 A | 1/1999 | Ried |
| 6,165,911 A | 12/2000 | Calveley |
| 6,218,086 B1 * | 4/2001 | Binnig et al. ............... 430/330 |
| 6,309,580 B1 | 10/2001 | Chou |
| 6,334,856 B1 | 1/2002 | Allen et al. |
| 6,334,960 B1 | 1/2002 | Willson et al. |

(Continued)

FOREIGN PATENT DOCUMENTS

DE 1 953 494 B1 12/1970

(Continued)

OTHER PUBLICATIONS

Pozidis, H.; Haberle, W.; Wiesmann, D..; Drechsler, U.; Despont, M.; Albrecht, T.R.; Eleftheriou, E. "Demonstration of Thermomechanical Recording at 641 Gbit/in$^2$." Jul. 2004. IEEE Transactions on Magnetics. vol. 40; pp. 2531-2536.*

(Continued)

*Primary Examiner* — Philip C Tucker
*Assistant Examiner* — Vicki Wu
(74) *Attorney, Agent, or Firm* — Pillsbury Winthrop Shaw Pittman LLP

(57) ABSTRACT

An imprint lithography apparatus is disclosed which has a needle, and a substrate table arranged to hold a substrate to be imprinted, wherein the needle is moveable between a first position and a second position, the first position being such that in use the needle penetrates a layer of imprintable material on the substrate, and the second position being such that in use the needle is disengaged from the imprintable material on the substrate, the substrate table and the needle arranged such that one may be scanned relative to the other.

20 Claims, 10 Drawing Sheets

U.S. PATENT DOCUMENTS

| | | |
|---|---|---|
| 6,365,059 B1 | 4/2002 | Pechenik |
| 6,375,870 B1 | 4/2002 | Visovsky et al. |
| 6,471,903 B2 | 10/2002 | Sherman et al. |
| 6,482,742 B1 | 11/2002 | Chou |
| 6,518,189 B1 | 2/2003 | Chou |
| 6,558,361 B1 | 5/2003 | Yeshurun |
| 6,600,162 B1 | 7/2003 | Hahmann et al. |
| 6,656,341 B2 | 12/2003 | Petersson et al. |
| 6,663,820 B2 | 12/2003 | Arias et al. |
| 6,696,220 B2 | 2/2004 | Bailey et al. |
| 6,719,915 B2 | 4/2004 | Willson et al. |
| 6,743,211 B1 * | 6/2004 | Prausnitz et al. ............. 604/239 |
| 6,835,184 B1 | 12/2004 | Sage et al. |
| 6,847,433 B2 | 1/2005 | White et al. |
| 6,908,453 B2 | 6/2005 | Fleming et al. |
| 6,921,615 B2 | 7/2005 | Sreenivasan et al. |
| 7,141,808 B2 | 11/2006 | Rangelow et al. |
| 7,166,086 B2 | 1/2007 | Haider et al. |
| 7,170,589 B2 | 1/2007 | Cherala et al. |
| 7,281,810 B2 * | 10/2007 | Lee ............................... 359/850 |
| 7,329,361 B2 * | 2/2008 | Guha et al. ....................... 216/2 |
| 7,354,698 B2 * | 4/2008 | Van Santen et al. ........... 430/311 |
| 7,517,211 B2 * | 4/2009 | Kruijt-Stegeman et al. .. 425/385 |
| 2002/0093122 A1 | 7/2002 | Choi et al. |
| 2002/0094496 A1 | 7/2002 | Choi et al. |
| 2002/0132482 A1 | 9/2002 | Chou |
| 2002/0167117 A1 | 11/2002 | Chou |
| 2002/0177319 A1 | 11/2002 | Chou |
| 2003/0022470 A1 * | 1/2003 | Liu et al. ....................... 438/496 |
| 2003/0034329 A1 | 2/2003 | Chou |
| 2003/0080471 A1 | 5/2003 | Chou |
| 2003/0080472 A1 | 5/2003 | Chou |
| 2003/0081193 A1 | 5/2003 | White et al. |
| 2003/0127580 A1 | 7/2003 | Ling et al. |
| 2003/0139042 A1 | 7/2003 | Heidari |
| 2003/0141291 A1 | 7/2003 | Heidari et al. |
| 2003/0159608 A1 | 8/2003 | Heidari |
| 2003/0170053 A1 | 9/2003 | Montelius et al. |
| 2003/0189273 A1 | 10/2003 | Olsson |
| 2004/0005444 A1 | 1/2004 | Heidari |
| 2004/0009673 A1 | 1/2004 | Sreenivasan et al. |
| 2004/0021068 A1 | 2/2004 | Staats |
| 2004/0021866 A1 | 2/2004 | Watts et al. |
| 2004/0022888 A1 | 2/2004 | Sreenivasan et al. |
| 2004/0026007 A1 | 2/2004 | Hubert et al. |
| 2004/0036201 A1 | 2/2004 | Chou et al. |
| 2004/0046288 A1 | 3/2004 | Chou |
| 2004/0081798 A1 | 4/2004 | Lee et al. |
| 2004/0124566 A1 | 7/2004 | Sreenivasan et al. |
| 2004/0146433 A1 * | 7/2004 | Massaro ........................ 422/100 |
| 2004/0149367 A1 | 8/2004 | Olsson et al. |
| 2004/0169003 A1 | 9/2004 | Lee et al. |
| 2004/0192041 A1 | 9/2004 | Jeong et al. |
| 2004/0200411 A1 | 10/2004 | Willson et al. |
| 2004/0209470 A1 | 10/2004 | Bajorek |
| 2004/0219249 A1 | 11/2004 | Chung et al. |
| 2004/0219461 A1 | 11/2004 | Chung et al. |
| 2005/0039618 A1 | 2/2005 | Heidari et al. |
| 2005/0064054 A1 | 3/2005 | Kasumi |
| 2005/0225011 A1 * | 10/2005 | Rangelow et al. ............ 264/485 |
| 2005/0255237 A1 | 11/2005 | Zhang et al. |
| 2005/0263077 A1 | 12/2005 | GanapathiSubramanian et al. |
| 2006/0231979 A1 * | 10/2006 | Santen et al. ................. 264/319 |

FOREIGN PATENT DOCUMENTS

| | | |
|---|---|---|
| EP | 0 376 045 A | 7/1990 |
| EP | 1484644 A2 * | 12/2004 |
| GB | 190001523 A | 4/1900 |
| JP | 08-020072 A | 1/1996 |
| JP | 2001-326156 A | 11/2001 |
| JP | 2003-178947 A | 6/2003 |
| JP | 2004-164711 A | 6/2004 |
| JP | 2004-288784 A | 10/2004 |
| JP | 2004-288802 A | 10/2004 |
| JP | 2004-288804 A | 10/2004 |
| JP | 2004288784 A * | 10/2004 |
| WO | WO 01/79591 A1 | 10/2001 |
| WO | WO 01/79592 A1 | 10/2001 |
| WO | 02/091041 A1 | 11/2002 |
| WO | WO 03081171 A1 * | 10/2003 |

OTHER PUBLICATIONS

Australian Written Opinion and Search Report issued on Sep. 17, 2008 in Singapore Application No. 200603176-9.

Stephen Y. Chou, et al., "Nanoimprint Lithography", J. Vac. Sci. Technol. B 14(6), Nov./Dec. 1996, pp. 4129-4133.

Nelson B A et al.: "Transport in Thermal Dip Pen Nanolithography" Proceedings of Nano. Integrated Nanosystems: Design, Synthesis and Applications, ASME, US, Sep. 22, 2004, pp. 125-126, XP008074369.

Pozidis et al., Demonstration of Thermomechanical Recording at 641 Gbit/in2, Jul. 2004, IEEE Transaction on Magnetics, vol. 40, No. 4, pp. 2531-2536.

European Search Report dated Nov. 26, 2007 for corresponding Application No. EP 06 25 2374.

Notice of Reasons for Rejection for Japanese Patent Application No. 2006-135305 dated Apr. 28, 2009.

Decision of Rejection for Japanese Patent Application No. 2006-135305 dated Sep. 30, 2009.

* cited by examiner

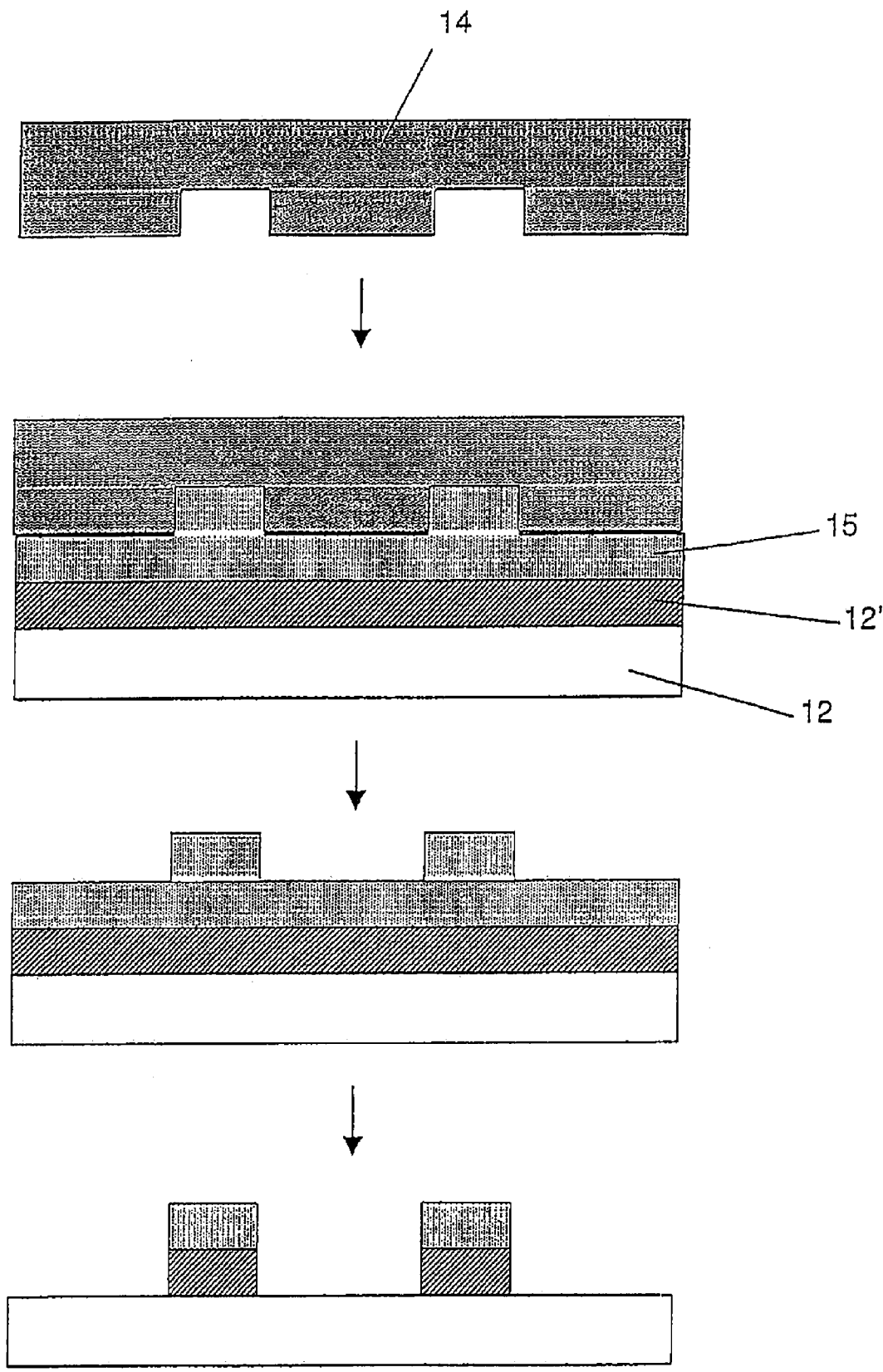
PRIOR ART     Figure 1b

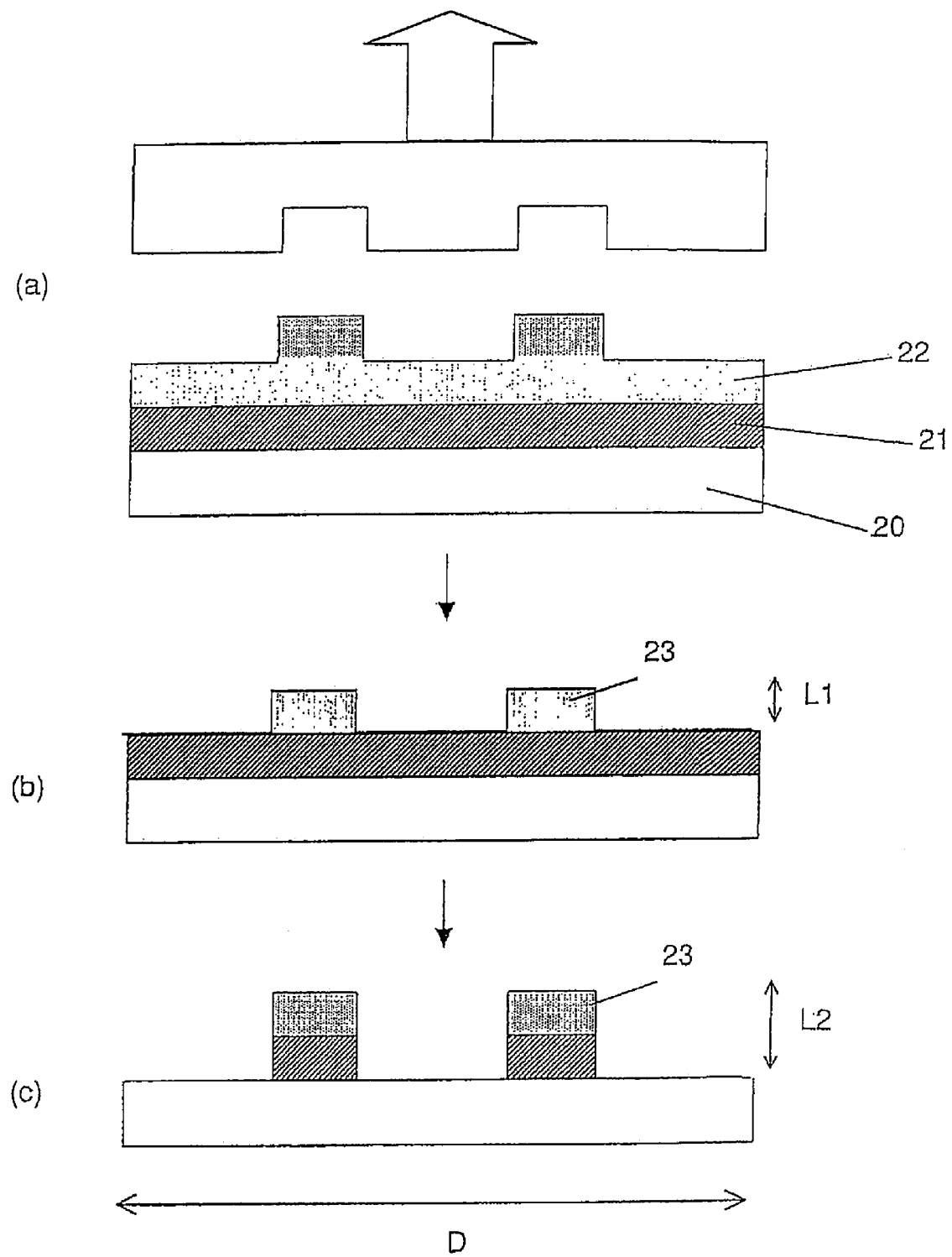
PRIOR ART Figure 2

US 7,931,844 B2

IMPRINT LITHOGRAPHY

The present application is a continuation of U.S. patent application Ser. No. 11/129,577, filed on May 16, 2005 now U.S. Pat. No. 7,442,029, the entire contents of the foregoing application herein fully incorporated by reference.

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate, such as a semiconductor material, into which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

The resolution of imprint lithography is limited only by the resolution of the template fabrication process. For instance, imprint lithography may be used to produce features in the sub-50 nm range with significantly improved resolution and line edge roughness compared to that achievable with conventional optical lithography processes. In addition, imprint processes do not require expensive optics, advanced illumination sources or specialized resist materials typically required by optical lithography processes Manufacture of a template may be expensive and time consuming. Where a large number of substrates are processed using a template, the cost of manufacturing the template may be recovered by adding a small amount to the price for which each substrate is sold. However, if a small number of substrates are to be processed, or even a single substrate, then the cost of manufacturing the template may not easily be recovered, and this may mean that manufacture of the template is not economically viable.

SUMMARY

According to a first aspect, there is provided an imprint lithography apparatus comprising a needle, and a substrate table arranged to hold a substrate to be imprinted, wherein the needle is moveable between a first position and a second position, the first position being such that in use the needle penetrates a layer of imprintable material on the substrate, and the second position being such that in use the needle is disengaged from the imprintable material on the substrate, the substrate table and the needle arranged such that one may be moved relative to the other.

According to a second aspect, there is provided an imprint lithography template comprising a needle moveable between a first position and a second position, the first position being such that in use the needle penetrates a layer of imprintable material, and the second position being such that in use the needle is disengaged from the imprintable material.

According to a third aspect, there is provided a method of imprint lithography, comprising:

moving a substrate or an array of individually controllable needles relative to the other;

actuating a first set of the needles such that they penetrate imprintable material on the substrate; and actuating a different second set of the needles such that they penetrate the imprintable material on the substrate, such that an imprinted pattern is formed in the imprintable material.

Embodiments of the invention are applicable to any imprint lithography process in which a patterned template is imprinted into an imprintable medium in a flowable state, and for instance can be applied to hot and UV imprint lithography as described above.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 1a-1c illustrate examples of conventional soft, hot and UV lithography processes respectively;

FIG. 2 illustrates a two step etching process employed when hot and UV imprint lithography is used to pattern a resist layer;

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
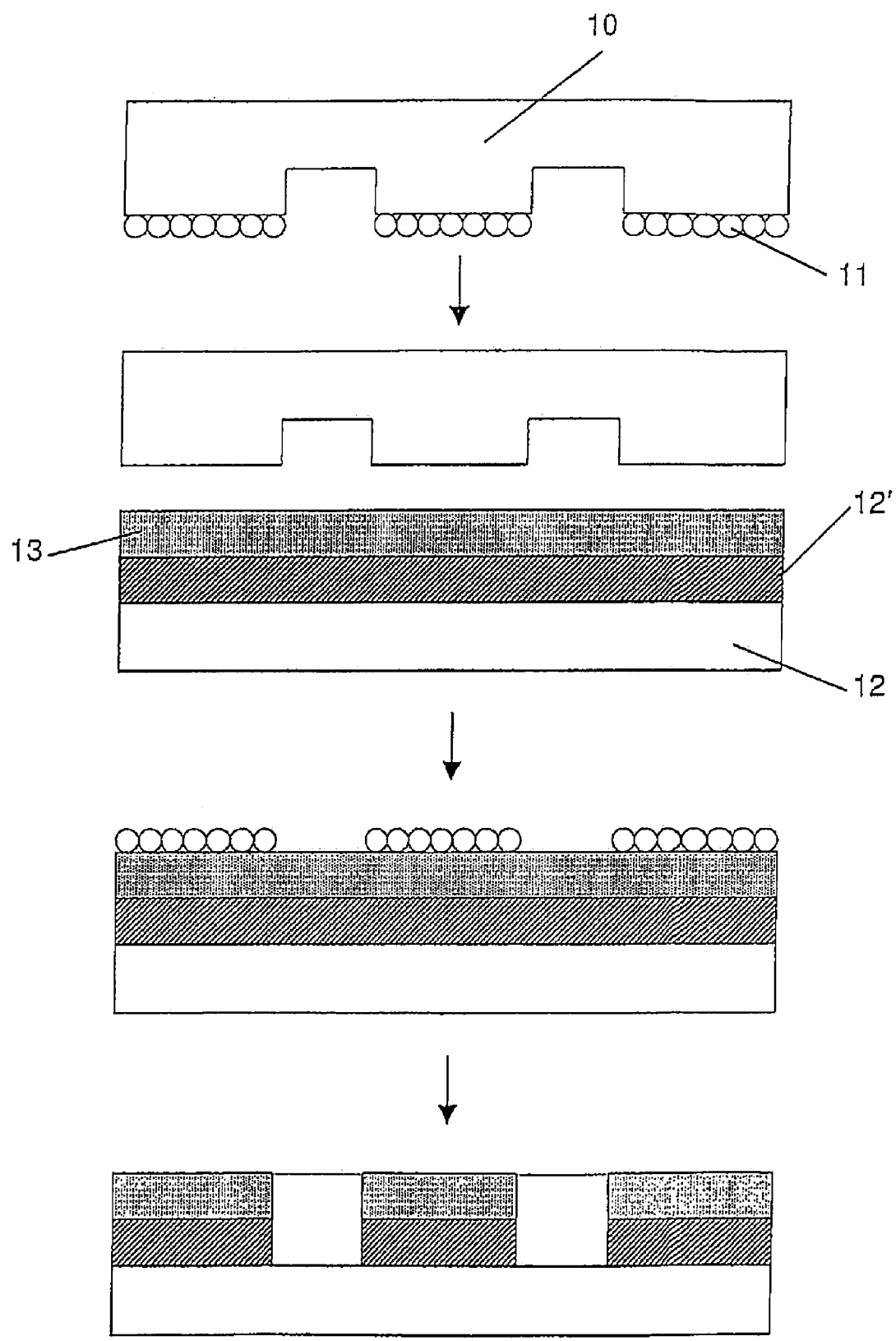
Figure 1C:
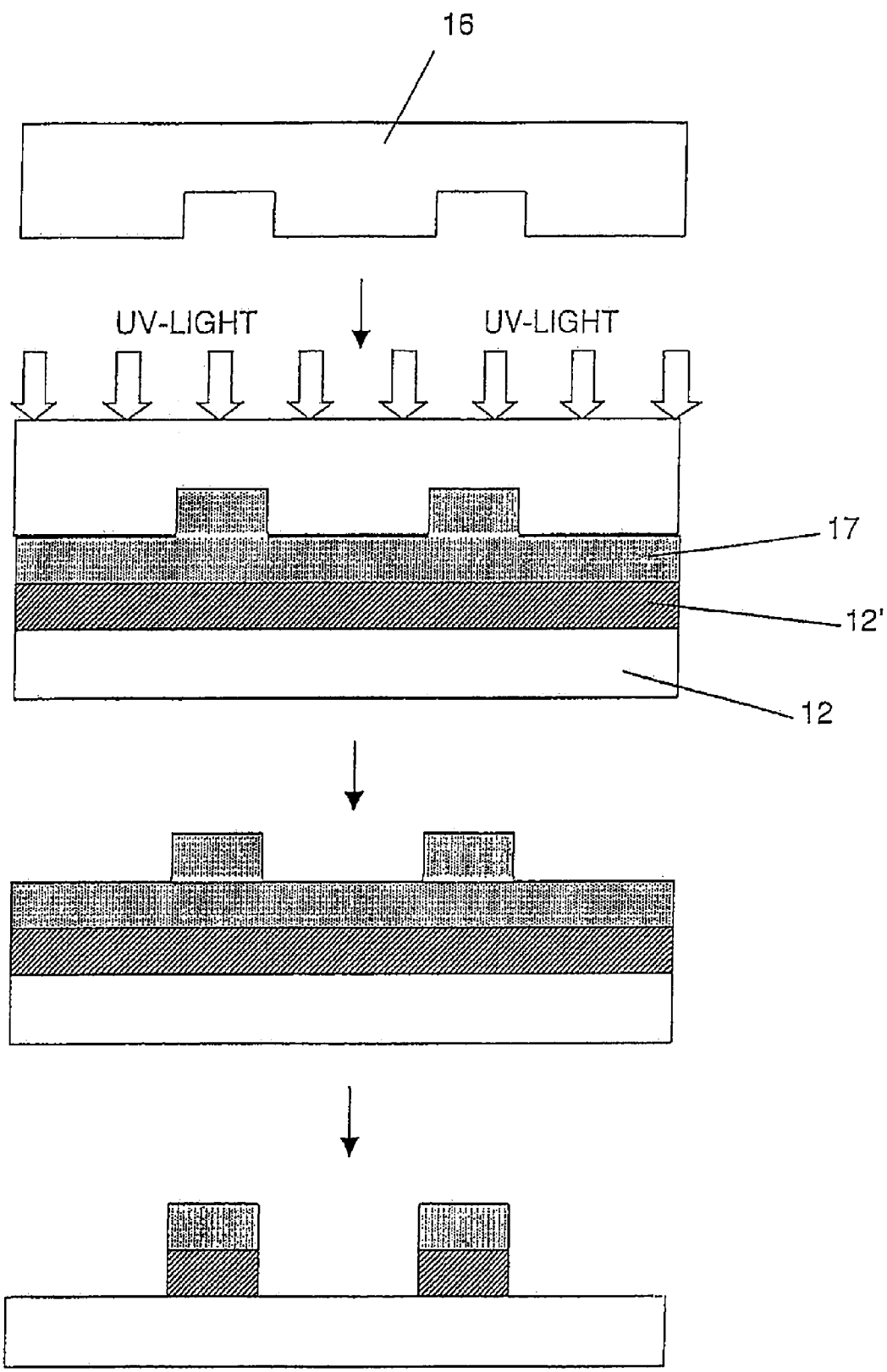

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure needed for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylate. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow.

Although reference is made herein to depositing UV curable liquids onto a substrate, the liquids could also be deposited on the template and in general the same techniques and considerations will apply.

Figure 3:
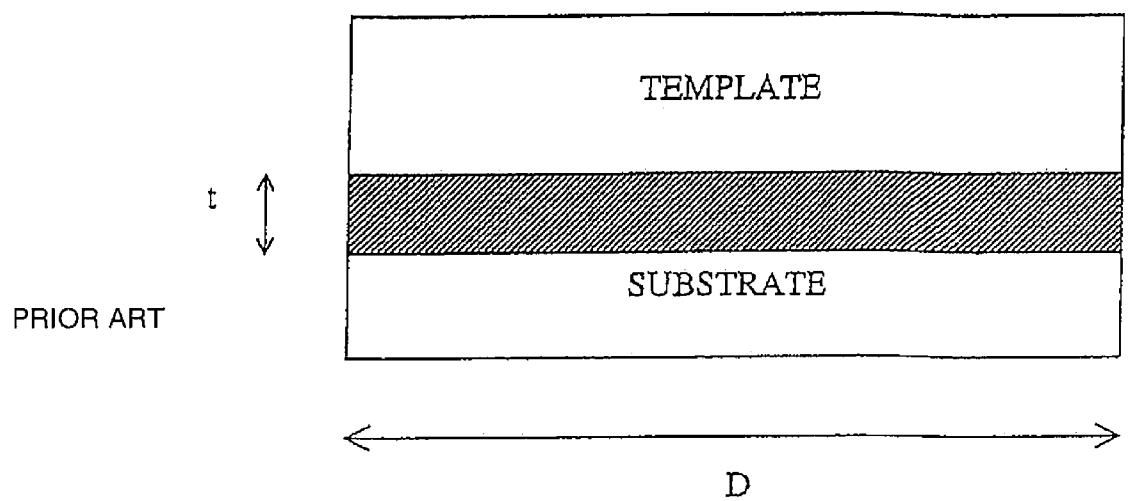
FIG. 3 schematically illustrates a template and a typical imprintable resist layer deposited on a substrate.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or overlay accuracy is required. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the desired pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1x mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

Figure 4:
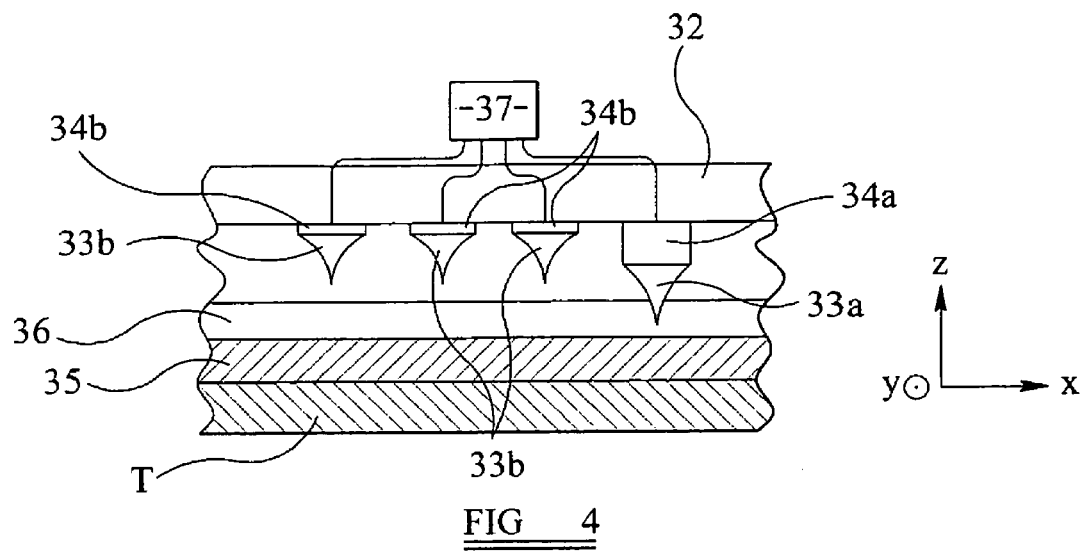
FIG. 4 is a schematic illustration of part of an imprint template according to an embodiment of the invention.

While in the description herein, particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non-linear response, etc. For example, the functional material may form a conductive layer, a semi-conductive layer, a dielectric layer or a layer having another desirable mechanical, electrical or optical property. Some organic substances may also be appropriate functional materials. Such applications may be within the scope of the invention FIG. 4 schematically shows part of an imprint template according to an embodiment of the invention. The imprint template comprises a plate 32 upon which several needles 33 are mounted. The needles 33 are fixed to the plate 32 via piezo actuators 34, each needle 33 being mounted on a separate piezo actuator 34. A substrate 35 is held on a substrate table T beneath the needles 33. Cartesian coordinates are marked on FIG. 4, and the term 'beneath' should be understood to mean having a lower position in the z-direction The needles may be constructed from any suitable material that is hard and durable, and that may be manufactured in a useable shape. Examples of suitable materials include silicon or a metal like tungsten. A wear-resistant coating may be applied to the needles. In a configuration suitable for manufacture of flat panel displays, each needle may have a tip diameter of 1 micron, and the needles may be spaced apart by 200 microns. In an alternative configuration suitable for manufacture of integrated circuits (ICs), each needle may have a tip diameter of 50 nanometers, and the needles may be spaced apart by 1 micron. In general, the tip diameter may be between 10 nanometers and 2 microns, and the spacing between needles may be between 200 nanometers and 500 microns The piezo actuators 34 are movable between an extended configuration and a contracted configuration. When a piezo actuator is in the extended configuration, for example as shown by piezo actuator 34a, the corresponding needle 33a penetrates a layer of imprintable material 36 provided on the substrate 35. This first position will be referred to as the imprint position of the needle. When a piezo actuator is in the contracted configuration, the corresponding needle is not in contact with the imprintable material 36. This is illustrated by piezo actuators 34b and corresponding needles 33b. This second position will be referred to as the disengaged position of the needle A typical full possible range of movement of the piezo actuator 34a may be between 1 and 100 microns. However, the range of movement needed between the extended configuration and the contracted configuration, i.e. the range of movement needed to move the needle 33a between the imprint position and the disengaged position is likely to be around 1 micron or less The term 'needle' is intended to mean any suitably shaped element which may be used to penetrate the imprintable material. It is not intended to mean that the needle must be hollow, although some embodiments may be hollow. Similarly, it is not intended to mean that the needle must be pointed, although in one or more embodiments the needle may be pointed The piezo actuators 34 are controllable via controller 37 (e.g., control electronics) which applies voltages to the piezo actuators 34 (typically the voltages are in the range of 1-1000V). The voltages are provided to the piezo actuators 34 independently of one another, to allow each piezo actuator 34 to be independently controlled. By adjusting the voltage provided to a given piezo actuator, the actuator can be moved from the contracted configuration to the extended configuration and back again. It will be appreciated that instead of the piezo actuators 34, other suitable actuators may be used. For example, MEMs actuators may be used, and may be actuated for example electrostatically, magnetically, or using magnetostriction. MEMs actuators which are actuated thermally could be used, although they may have a low response frequency For ease of illustration, only a small number of piezo actuators 34 and needles 33 are shown in FIG. 4. However, it will be appreciated that many thousands of piezo actuators and needles may be provided on the plate 32, for example arranged in a two dimensional array, as will be described further below In use, the substrate 35 is scanned, using the substrate table T, in the y-direction underneath the plate 32. The needles 33 are moved between the disengaged position and the imprint position by the controller 37, such that a desired pattern is imprinted onto the imprint material 6 on the substrate 35

Figure 5A:
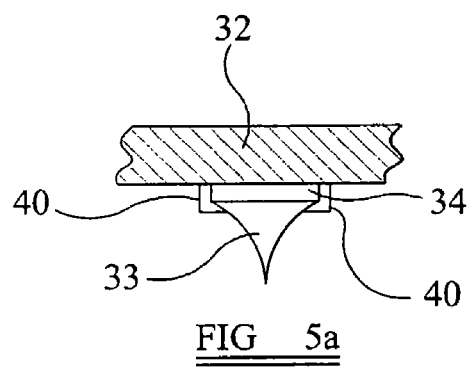
FIG. 5 is a schematic illustration showing various ways in which the imprint template of FIG. 4 may cure an imprintable resist layer.

The imprintable material 36 may be cured using the needles 33. This may be done by inducing a chemical reaction in the imprintable material 36 which cures a small portion of the imprintable material around the needle. There are many ways in which such a chemical reaction could be activated, and several examples are explained below The chemical reaction may be activated thermally by heating the needles 33 such that they activate a curing chemical reaction when they come into contact with the imprintable material 36. It is not necessary that the needles 33 are modulated between high and low temperatures, instead the needles may be maintained at a constant high temperature, since activation of the chemical reaction will only occur when the needles 33 are in the imprint position (i.e., in contact with the imprintable material 36). As shown schematically in FIG. 5a, a heater for a needle 33 may comprise wires 40 arranged to pass a heating current to the needle 33. Since the piezo actuator 34 typically comprises a single continuous piece of ceramic, the wires 40 pass around the outside of the piezo actuator 34. Suitable imprintable materials that may be used include thermoplastic polymer resins, for example poly (methyl methacrylate), polystyrene, poly (benzyl methacrylate) or poly (cyclohexyl methacrylate)

Figure 5B:
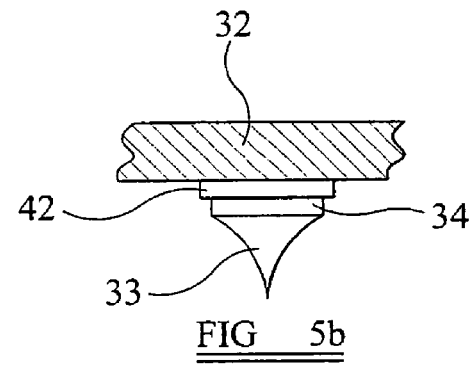
Figure 5C:
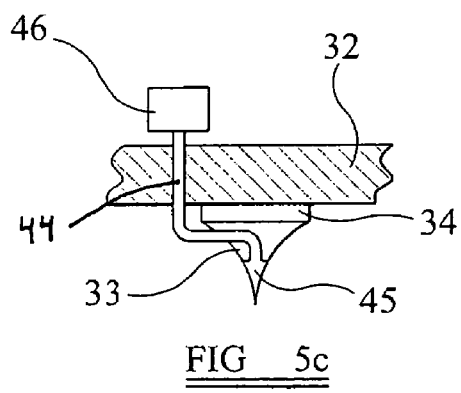
Figure 5D:
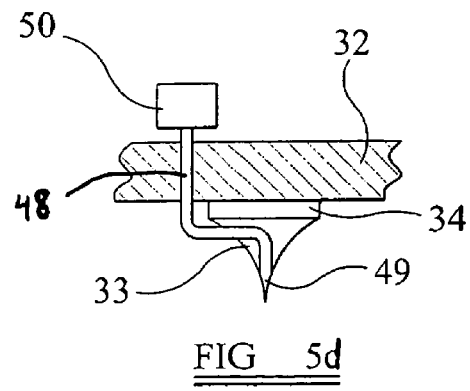

An alternative or additional method of thermally inducing a chemical reaction is shown schematically in FIG. 5b. Referring to FIG. 5b, the needle 33 and piezo actuator 34 are mounted on a vibrational mounting 42. The vibrational mounting 42 is arranged to apply a small but vigorous vibration, for example in the y-direction, such that when the needle 33 is in the imprint position the vibration causes movement of the imprintable material 36, thereby introducing energy by friction which activates a curing chemical reaction in the imprintable material 36. In an alternative or additional embodiment (not illustrated), instead of providing a separate vibrational mounting 42 for each needle, the plate 32 is vibrated or the substrate table T and substrate 35 are vibrated. It is not necessary that the needle 33 is vibrated only when it is in the imprint position, since vibration of the needle when it is in the disengaged position will not cause curing of the imprintable material 36. Again, suitable imprintable materials that may be used include thermoplastic polymer resins, for example poly (methyl methacrylate), polystyrene, poly (benzyl methacrylate) or poly (cyclohexyl methacrylate). The needle may be made to vibrate at an ultra-sonic frequency. Where this is done, when the needle comes into contact with imprintable material which is thermoplastic, friction will cause the imprintable material to melt thereby making an impression of the needle. After retraction the material will quickly solidify leaving the impression of the needle FIG. 5c shows schematically an additional or alternative method for curing the imprintable material. Referring to FIG. 5c, an optical fiber 44 is used to transport radiation to a needle 33. The radiation may have a wavelength of for example 365 nanometers. The needle is transparent, at least in a lower portion 45. Radiation is provided to the transparent lower portion 45 of the needle 33 when the needle is in the imprint position. Radiation is thereby injected from the transparent lower portion 45 of the needle 33 into the imprintable material 36, and activates a curing chemical reaction in the local area surrounding the needle 33. The optical fiber 44 passes up through the plate 32 to a radiation source 46. The radiation source is turned on only when the needle 33 is in the imprint position, and is turned off when the needle 33 is in the disengaged position. This is to prevent stray radiation being emitted from the transparent portion 45 of the needle 33 and causing unwanted activation of the curing chemical reaction over a widespread area. An advantage of the arrangement shown in FIG. 5c when compared with conventional optical lithography is that, because there is no lens system, chromatic aberration ceases to be an issue and hence broad-band illumination may be used. For example, instead of using 365 nanometer radiation (as mentioned above), illumination with radiation having a bandwidth extending from 350 to 400 nanometers may be used. Suitable imprintable materials that may be used include monomers such as an acrylate or methacrylate. In general any photopolymerizable material could be used, such as a mixture of monomers and an initiator. The curable liquid may also, for instance, include a dimethyl siloxane derivative FIG. 5d shows schematically an additional or alternative manner in which a curing chemical reaction may be activated in the imprintable material. Referring to FIG. 5d, a tube 48 is used to carry a chemical to a tip 49 of the needle 33. A pump 50 pumps the chemical into the tube 48 when the needle 33 is penetrating the imprintable material 36, so that the chemical is injected into the local area of imprintable material that surrounds the needle 33. The chemical is selected to activate a curing chemical reaction. Suitable chemicals that may be used include a photoinitiator (for example, one from the Irgacure family), or a thermal initiator like benzoyl peroxide or AIBN (2,2'-azo-diisobutyronitrile)

Figures 6A, 6B, 6C:
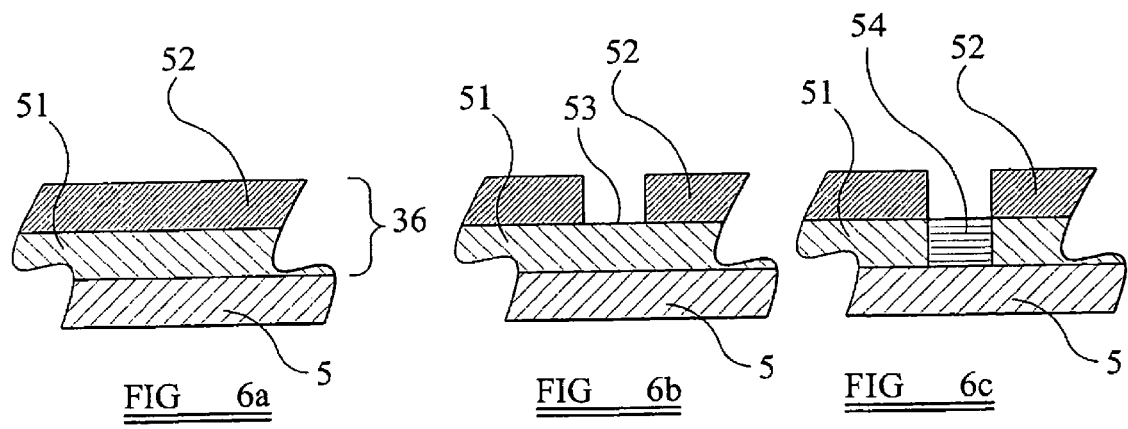
FIG. 6 schematically depicts an imprinting and curing method which may be used according to an embodiment of the invention.
Figure 7:
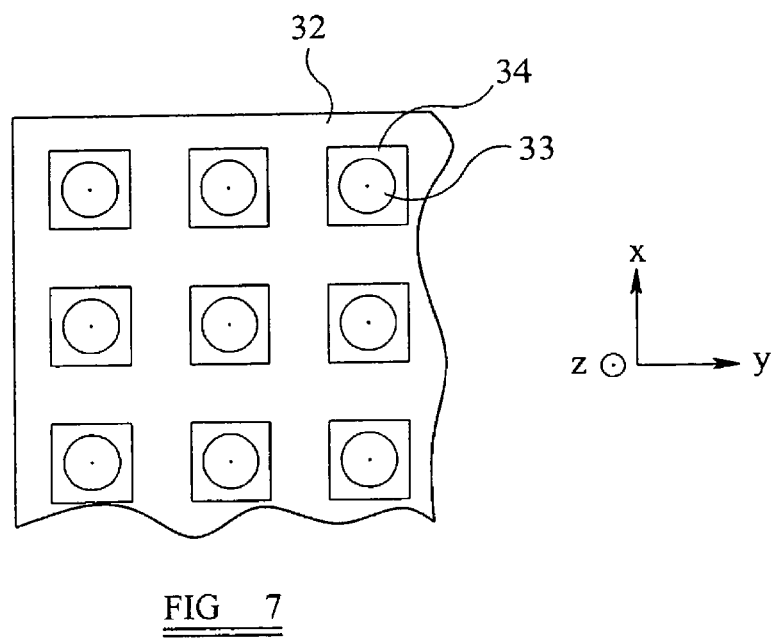
FIG. 7 is a schematic illustration from beneath of the imprint template of FIG. 4.
Figure 8:
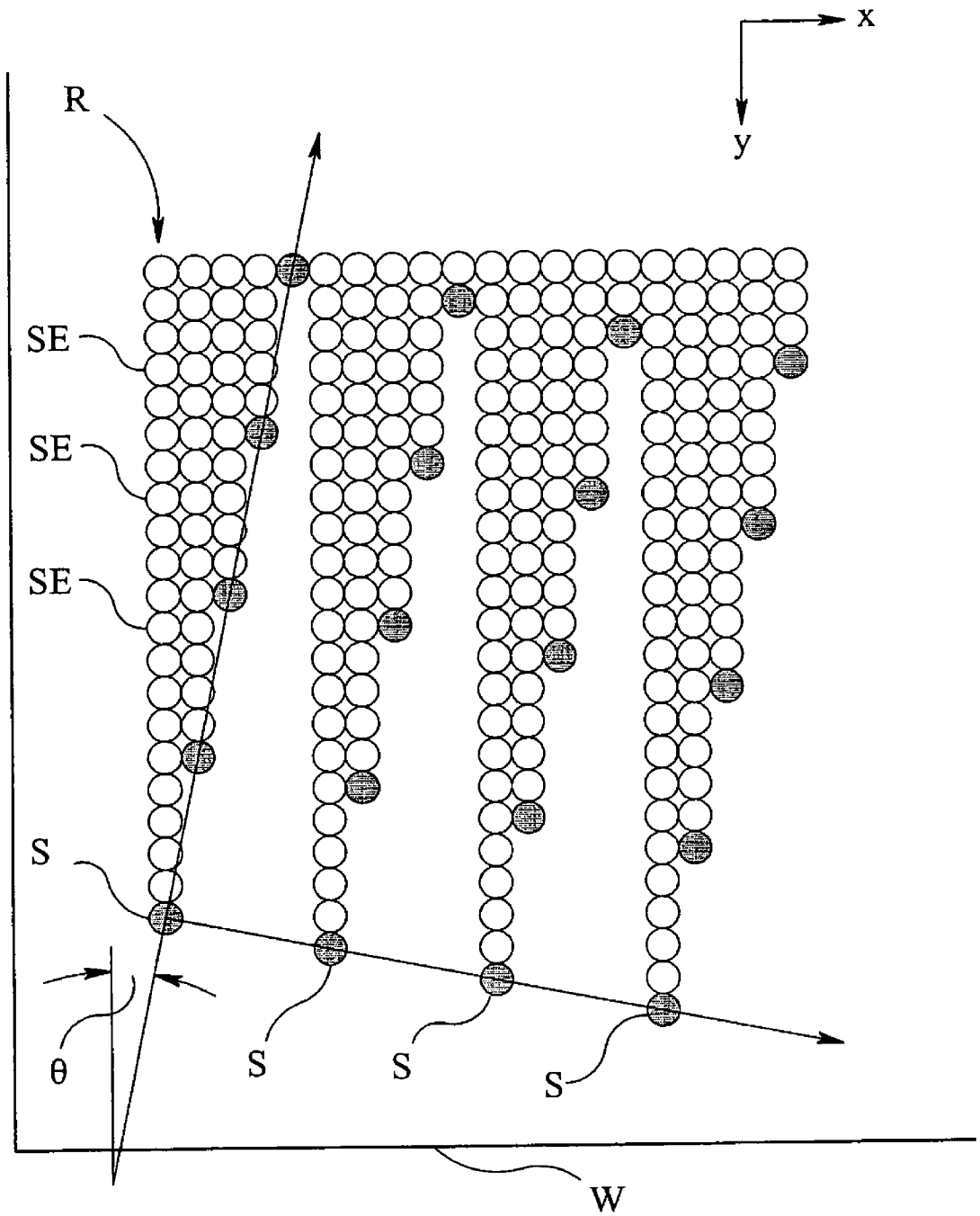
FIG. 8 schematically depicts a substrate which has been imprinted using an embodiment of the invention.

An alternative or additional method of activating the chemical reaction comprises making the needles from a material which is a catalyst. The catalyst may be selected to induce a reaction in the imprintable material 36 when it comes into contact with the imprintable material. An additional or alternative method comprises providing the imprintable material as two or three layers of different materials, such that when the needle 33 is in the imprint position it mixes the layers, and chemicals contained in the layers, to induce curing. One way in which this may be achieved is via atom transfer radical polymerization. This may be done, for example, by providing alkyl halide in the imprintable material and a Cu(I) complex in the needles The imprintable material 36 may be provided as a protection layer and a reaction layer. This is shown schematically in FIG. 6a, in which a substrate 35 is provided with an imprintable layer 36 comprising a reaction layer 51 covered by a protection layer 52, which may be, for example, Teflon. As shown schematically in FIG. 6b, a needle of the apparatus (not illustrated) may be used to breach the protection layer 52 thereby forming a hole 53. The protection layer is sufficiently stiff that it will not flow back into the hole 53 that has been formed. Following this, chemical processing is used to activate a curing reaction in the reaction layer 51. As shown schematically in FIG. 6c, curing takes place only in a region 54 located directly beneath the hole 53, the protection layer preventing curing chemicals from reaching the other parts of the reaction layer 51. In this way, a pattern that was formed by needles in the protection layer 52 is transferred to the reaction layer 51 and is cured. In a related arrangement, the chemical processing may be such that regions located directly beneath holes are dissolved, and regions located beneath the protection layer remain As previously mentioned, the needles and piezo actuators may be provided in a two dimensional array upon the plate 32. An example of such an array is illustrated schematically in FIG. 7, which shows the plate 32 viewed from beneath, together with a 3×3 array of piezo actuators 34 and needles 33. It will be appreciated that in practice a much larger array of piezo actuators and needles may be used FIG. 8 illustrates schematically how a pattern on a substrate W may be generated. The filled in circles represent an array of needles S forming spots on the substrate (the figure assumes that all of the needles are in the imprint position). The open circles SE represent spots that have previously been imprinted by the needles. As shown, each needle imprints a row R of spots on the substrate W. The complete pattern for the substrate is generated by the sum of all the rows R of spots SE imprinted by each of the needles. In practice, there will be overlap between the rows R of spots SE, such that any desired location on the substrate W may be imprinted. The overlap is not shown in FIG. 8, which is simplified for illustrative purposes. There may also be overlap of the spots SE in the x-direction. Again, this is not shown in FIG. 8 in order to simplify the illustration It can be seen that the array of needles S is arranged at an angle θ relative to the y-direction (standard Cartesian coordinates are shown in FIG. 8). This is done so that when the substrate W is moved in the y-direction (the scanning direction), each needle S will pass over a different area of the substrate, thereby allowing the entire substrate to be covered by the array of needles S. In an embodiment, the angle θ is, for instance, at most 20°, at most 10°, at most 5°, at most 3°, at most 1°, at most 0.5°, at most 0.25°, at most 0.10°, at most 0.05°, or at most 0.01°. In an embodiment, the angle θ is at least 0.0001°, e.g. at least 0.001°

Figure 9:
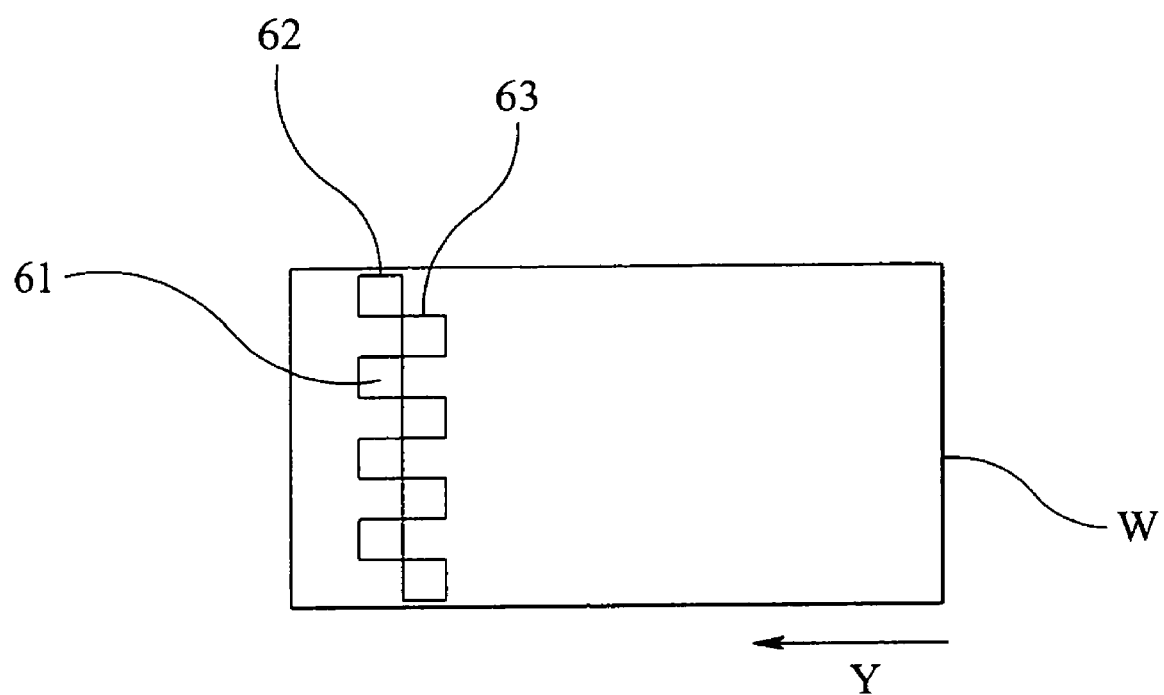
FIG. 9 is a schematic illustration of a configuration of several of the imprint templates of FIG. 4.
Figure 10:
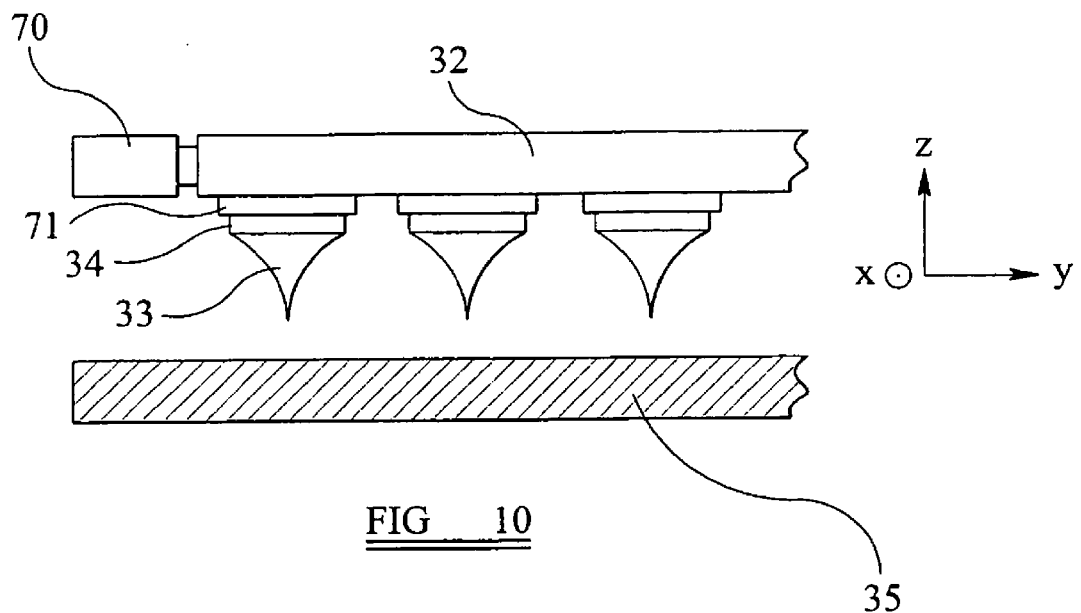
FIG. 10 is a schematic illustration of an imprint template according to an embodiment of the invention.
Figure 11:
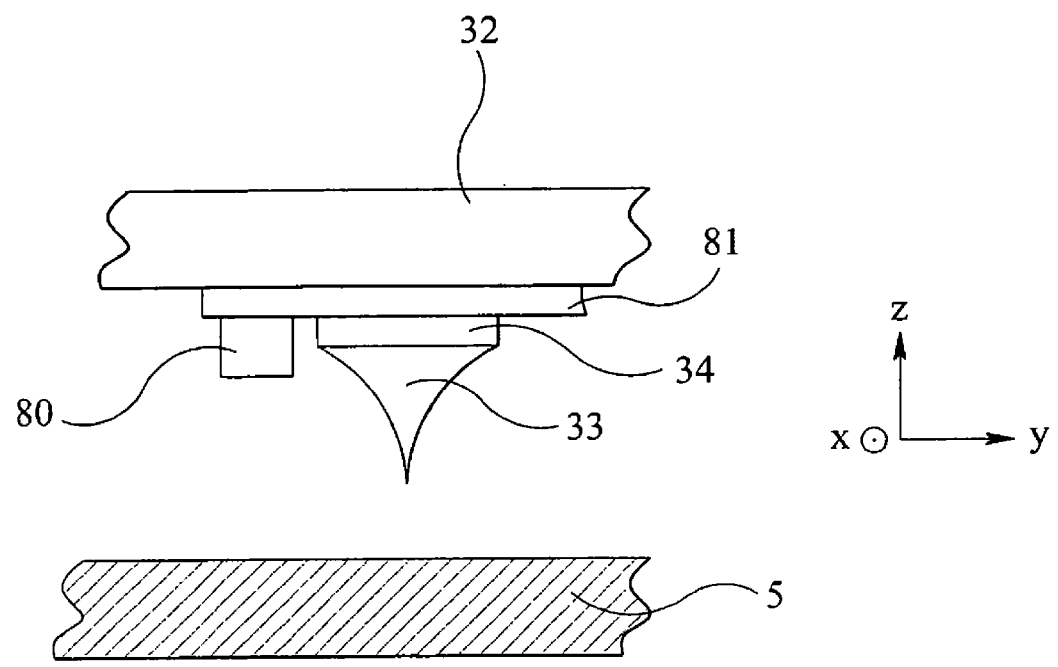
FIG. 11 is a schematic illustration of a needle of an imprint template according to an embodiment of the invention.

FIG. 9 shows schematically how an entire substrate W may be imprinted in a single scan, by using a plurality of arrays of needles. Eight arrays 61 of needles are arranged in two rows 62, 63 in a 'chess board' configuration such that the edge of one array of needles slightly overlaps (in the x-direction) with the edge of the adjacent array of needles. In an embodiment, the arrays of needles may be arranged in, for instance, at least 3 rows, at least 4 rows or at least 5 rows. In this way, a band of needles extends across the width of the substrate W, allowing a pattern to be imprinted to the entire substrate in a single scan. It will be appreciated that any suitable number of arrays of needles may be used. In an embodiment, since the arrays of needles are effectively MEMs devices, there may be a limit to the size of array that can be efficiently fabricated. For this reason, if it is desired to expose an entire flat panel display substrate with a single scan, 100 arrays, 1000 arrays or even more may be used Referring to FIG. 10, a height sensor 70 (for example, an optical sensor) is provided at one end of the plate 32, such that during scanning of the substrate 35 (in the y-direction) the height sensor 70 detects the height of the substrate before it passes beneath the plate 32. A second set of piezo actuators 71 may be used to actuate the needles 33 to take account of unevenness in the substrate 35, based upon input from the height sensor 70. The second set of piezo actuators 71 are located between the first set of piezo actuators 34 and the plate 32. Although FIG. 10 shows a piezo actuator 71 being provided for each individual needle 33, it will be appreciated that because the spatial frequency of the unevenness of the substrate 35 is relatively low, several needles may be mounted on a single larger piezo actuator which may still effectively compensate for unevenness of the substrate A separate controller (not illustrated) connected to the sensor 70 is used to actuate the second set of piezo actuators 71. In an alternative embodiment, a single controller may be used to actuate the first and second sets of piezo actuators. In some instances it may be preferred not to have a second set of piezo actuators, and instead to use only one set of piezo actuators, both to take account of substrate unevenness and to move the needles 33 to and from the imprint position. In order to do this, the distance over which the piezo actuators are capable of moving in the z-direction must be sufficiently large to compensate for unevenness of the substrate 35, in addition to being able to move the needles 33 from the disengaged position to the imprint position In an embodiment, instead of or in addition to providing a sensor next to the plate, individual sensors formed from MEMs devices may be provided for each needle. This is shown schematically in FIG. 10, in which a sensor 80 (e.g., an optical sensor) is mounted on a piezo actuator 81 upon which a needle 33 is also mounted (via a piezo actuator 34). The sensor 80 is located ahead of the needle 33 (in the y-direction), so that when the substrate 35 is scanned beneath the needle 33, the height of the substrate is measured before it reaches the needle. The sensor 80 is connected in a feedback loop with the piezo actuator 81 and is set up to maintain a constant height between the substrate 35 and the sensor 80. For example, the constant height may be 30 microns. If the height deviates from the desired height, then the piezo actuator 81 is adjusted until the correct height is restored. Since the sensor 80 is located very close to the needle 33, this means that the needle 33 may be maintained at an optimum height in relation to the substrate 35. For example, the needle 33 may be 10 microns above the substrate 35 when it is in the disengaged position. It will be appreciated that the distances referred to are examples, and that other suitable distances may be used. For example, an optimum distance between the needle 33 and the substrate 35 may be selected to be 1 micron when the needle is in the disengaged position In an embodiment, the needle 33 may itself be used as height sensor, for example by providing a charge to the needle using the same principle as is used in a tunneling electron microscope or an atomic force electron microscope Although in the above described embodiments of the invention the needles have been independently moveable, it will be understood that this is not necessarily always the case. For example, a small group of needles may be fixed such that they all move together and are not independently moveable (for example, a cluster of five needles may move together). In general, it is desired (although not necessary) that each needle be independently moveable It will be appreciated that the fluid properties of the imprintable material may be significant to an embodiment of the invention. In an embodiment, if the imprintable material is too fluid then an impression made in the imprintable material by a needle may close due to surface tension. Where this is the case the imprintable material should comprise a suitable gel or a thermoplastic material below the glass transition temperature. The hardness of the gel or thermoplastic material may be selected based on the size of features to be imprinted (a smaller feature size will need a harder gel or thermoplastic material). Suitable materials will be apparent to those skilled in the art. The gel may comprise a monomer and two initiators, a first initiator sensitive to a wavelength of radiation which may be used to 'pre-cure' the gel prior to imprint such that it is sufficiently stiff, the second initiator being sensitive to a different wavelength of radiation and being used to cure the gel after imprint In the above described embodiments, a substrate has been fixed to a substrate table, which has been scanned beneath the array of needles. It is not necessary that this is always the case. For example, the substrate table and substrate may be fixed, with the array of needles being arranged to scan over the substrate. Alternatively, the substrate table may be configured such that the substrate passes in a scanning motion over a surface of the substrate table Although one or more embodiments have been described in terms of a two-dimensional array of needles, it will be appreciated that it may be possible to implement the invention with a one-dimensional array of needles, for example with the needles arranged in a line extending in the x-direction While specific examples of the invention have been described above, it will be appreciated that the present invention may be practiced otherwise than as described. The description is not intended to limit the invention.

The invention claimed is:

1. A method of imprint lithography, comprising:
moving a substrate or an array of individually controllable needles relative to the other;
actuating a first set of the needles such that they penetrate imprintable material on the substrate; and
actuating a different second set of the needles such that they penetrate the imprintable material on the substrate, such that an imprinted pattern is formed in the imprintable material.

2. The method according to claim 1, wherein actuating the first set of needles to penetrate the imprintable material is repeated a plurality of times until a desired imprinted pattern has been formed in the imprintable material.

3. The method according to claim 1, wherein the imprintable material comprises a reaction layer and a protection layer, the method comprising breaching the protection layer using the actuated needles, and then subsequently curing the reaction layer at one or more locations at which the protection layer was breached.

4. The method according to claim 1, wherein the imprintable material comprises three or more layers arranged such that they do not react with one another, the method comprising mixing the three layers using the actuated needles, so that at least two of the layers react with one another to begin a curing process.

5. An imprint lithography apparatus comprising an array of needles, and a substrate table arranged to hold a substrate to be imprinted, wherein the substrate table or the array of needles is movable relative to the other, and wherein the apparatus is configured to actuate a first set of the needles such that they penetrate imprintable material on the substrate and to actuate a different second set of the needles such that they penetrate the imprintable material on the substrate, such that an imprinted pattern is formed in the imprintable material.

6. The apparatus according to claim 5, configured to repeat a plurality of times actuation of the first set of needles to penetrate the imprintable material until a desired imprinted pattern has been formed in the imprintable material.

7. The apparatus according to claim 5, configured to actuate the needles to breach a protection layer of the imprintable material, and then subsequently to cure a reaction layer of the imprintable material at one or more locations at which the protection layer was breached.

8. The apparatus according to claim 5, configured to mix a plurality of layers of the imprintable material using the actuated needles, so that at least two of the plurality of layers react with one another to begin a curing process.

9. A method of imprint lithography, comprising:
   moving each needle of a plurality of needles, which together form an imprint template, with respect to another needle of the plurality of needles between a first position such that the needle penetrates an imprintable material on a substrate, and a second position such that the needle is disengaged from the imprintable material on the substrate, such that an imprinted pattern is formed in the imprintable material; and
   moving the substrate or the plurality of needles in a direction transverse to the direction of movement of the needles between the first and second positions.

10. The method according to claim 9, further comprising using a needle of the plurality of needles to cause localized curing of the imprintable material in proximity of the needle.

11. The method according to claim 9, further comprising heating a needle of the plurality of needles to a temperature sufficiently high to induce a local chemical reaction in imprintable material.

12. The method according to claim 9, further comprising vibrating a needle of the plurality of needles.

13. The method according to claim 9, further comprising delivering radiation from a needle of the plurality of needles when that needle is in the first position.

14. The method according to claim 9, further comprising injecting a curing chemical from a needle of the plurality of needles when that needle is in the first position.

15. The method according to claim 9, wherein the imprintable material comprises a reaction layer and a protection layer, the method further comprising breaching the protection layer using a needle of the plurality of needles, and then subsequently curing the reaction layer at the location at which the protection layer was breached.

16. The method according to claim 9, further comprising mixing a plurality of layers of the imprintable material using a needle of the plurality of needles, so that at least two of the plurality of layers react with one another to begin a curing process.

17. The method according to claim 9, wherein the needles are positioned in a two-dimensional array.

18. The method according to claim 17, wherein the array is disposed at an angle relative to the transverse direction of movement.

19. The method according to claim 9, further comprising receiving input from a height sensor indicative of a topography of the substrate, and adjusting a height of a needle to compensate for the topography of the substrate.

20. The method according to claim 9, wherein the plurality of needles comprises a plurality of arrays of needles, the arrays arranged in a chess-board configuration comprising two or more rows of arrays.

\* \* \* \* \*